(12) United States Patent
Kwok et al.

(10) Patent No.: US 9,299,863 B2
(45) Date of Patent: Mar. 29, 2016

(54) ULTRATHIN FILM MULTI-CRYSTALLINE PHOTOVOLTAIC DEVICE

(75) Inventors: Hoi Sing Kwok, Hong Kong (CN); Zhiguo Meng, Hong Kong (CN); Man Wong, Hong Kong (CN)

(73) Assignee: The Hong Kong University of Science and Technology, Hong Kong (CN)

(*) Notice: Subject to any disclaimer, the term of this patent is extended or adjusted under 35 U.S.C. 154(b) by 1010 days.

(21) Appl. No.: 12/437,236

(22) Filed: May 7, 2009

(65) Prior Publication Data

US 2010/0071760 A1    Mar. 25, 2010

Related U.S. Application Data

(60) Provisional application No. 61/071,591, filed on May 7, 2008.

(51) Int. Cl.

| | |
|---|---|
| *H01L 31/0236* | (2006.01) |
| *H01L 31/076* | (2012.01) |
| *H01L 31/028* | (2006.01) |
| *H01L 31/0368* | (2006.01) |
| *H01L 31/077* | (2012.01) |
| *H01L 31/18* | (2006.01) |

(52) U.S. Cl.
CPC .......... *H01L 31/0236* (2013.01); *H01L 31/028* (2013.01); *H01L 31/03682* (2013.01); *H01L 31/076* (2013.01); *H01L 31/077* (2013.01); *H01L 31/182* (2013.01); *Y02E 10/546* (2013.01); *Y02E 10/547* (2013.01); *Y02P 70/521* (2015.11)

(58) Field of Classification Search
USPC .......................................... 136/259
See application file for complete search history.

(56) References Cited

U.S. PATENT DOCUMENTS

| | | | | |
|---|---|---|---|---|
| 4,433,202 | A | * | 2/1984 | Maruyama et al. ........... 136/255 |
| 4,532,537 | A | * | 7/1985 | Kane ............................. 257/458 |
| 4,613,382 | A |   | 9/1986 | Katayama et al. |
| 4,644,091 | A | * | 2/1987 | Hayashi et al. ............... 136/259 |
| 4,922,218 | A | * | 5/1990 | Watanabe et al. ............. 136/261 |
| 5,184,200 | A |   | 2/1993 | Yamanobe |
| 5,259,891 | A | * | 11/1993 | Matsuyama et al. .......... 136/244 |
| 5,949,123 | A |   | 9/1999 | Le et al. |
| 6,388,301 | B1 | * | 5/2002 | Tawada et al. ................ 257/436 |
| 6,534,334 | B2 | * | 3/2003 | Sasaki ............................. 438/57 |

(Continued)

FOREIGN PATENT DOCUMENTS

WO    WO 2009/000136 A1    12/2008

OTHER PUBLICATIONS

Green et al., "Crystalline silicon on glass (CSG) thin-film solar cell modules," *Solar Energy*, 77, 857-863 (Aug. 26, 2004).

(Continued)

*Primary Examiner* — Devina Pillay
(74) *Attorney, Agent, or Firm* — Leydig, Voit & Mayer, Ltd.

(57) ABSTRACT

A solar cell photovoltaic device using ultrathin films of polycrystalline silicon and deep uneven surface structures is disclosed. According to one embodiment, the uneven structures include one or more pits having a depth of at least 10 microns. According to another embodiment, the uneven structures include one or more cones or columns having a height or at least 10 microns. Because the unevenness of the structures, the photovoltaic device is able to use a very thin layer of polycrystalline silicon to effectively trap and absorb light.

12 Claims, 26 Drawing Sheets

Poly-Si thin film solar cell

Substrate

(56) References Cited

U.S. PATENT DOCUMENTS

| | | |
|---|---|---|
| 6,538,195 B1 | 3/2003 | Shi et al. |
| 6,844,248 B2 | 1/2005 | Naseem et al. |
| 7,202,143 B1 | 4/2007 | Naseem et al. |
| 2003/0005956 A1* | 1/2003 | Hirata et al. ............... 136/256 |
| 2008/0072958 A1* | 3/2008 | Dutta ........................ 136/256 |
| 2008/0241356 A1* | 10/2008 | Fu et al. ...................... 427/74 |

OTHER PUBLICATIONS

Song et al., "Solid phase crystallized polycrystalline thin-films on glass from evaporated silicon for photovoltaic applications," *Thin Solid Films, 513*, 356-363 (Feb. 20, 2006).

* cited by examiner

ULTRATHIN FILM MULTI-CRYSTALLINE PHOTOVOLTAIC DEVICE

CROSS-REFERENCE TO RELATED APPLICATIONS

This patent application claims the benefit of U.S. Provisional Patent Application No. 61/071,591, filed May 7, 2008, which is herein incorporated by reference in its entirety.

FIELD OF THE INVENTION

The present invention is related to the application of ultrathin multi-crystalline silicon films to electronic devices and, in particular, to the fabrication of photovoltaic devices.

BACKGROUND OF THE INVENTION

Photovoltaic devices, also known as solar cells, are used to harvest energy from sunlight. Silicon is by far the most popular material used. Photovoltaic devices can be classified into bulk as well as thin film types. Bulk silicon solar cells are made of single crystal silicon or multi-crystalline silicon wafers. Such wafers are of at least 100 micron thickness. As such they require considerable silicon material and are economically wasteful. Thin film solar cells are those fabricated with the silicon film grown on inexpensive substrates such as glass. They consume much less silicon as they are generally 5 microns or less in thickness. However their energy conversion efficiencies are lower than the bulk wafer type. Much improvement is needed in making thin film silicon solar cells.

The thin films can be amorphous (a-Si), multi-crystalline (MC), microcrystalline (mC), nanocrystalline (nC), or single crystalline (C) in nature. Each of these devices of course has its own merits and drawbacks. Amorphous silicon thin film solar cells, for example, are the most mature technology, but have relatively low energy conversion efficiency and suffer from long term degradation. Crystalline silicon solar cells require wafer transfer or true epitaxial growth or high temperature annealing, all of which are impractical for mass production purposes.

The present invention concerns multi-crystalline silicon thin film solar cells and photovoltaic devices. Multi-crystalline silicon thin films are used in many other electronic devices other than solar cells. For example, MC silicon is used in thin film transistors for driving liquid crystals and other active matrix displays. There is a significant body of literature on the fabrication of MC thin films on glass at low temperature while avoiding deformation of the glass substrate or superstrate.

The application of MC silicon to solar cells has been investigated extensively. Reviews of the development of MC silicon solar cells can be found in Aberle, "Fabrication and characterisation of crystalline silicon thin-film materials for solar cells," *Thin Solid Films*, vol. 511-512, pp. 26-34, 2006, and Green et al, "Crystalline Silicon on Glass (CSG) Thin-Film Solar Cell Modules," *Solar Energy*, vol. 77, pp. 857-863, 2004. Commercial thin film MC solar cells are available. Technologically, MC films can be obtained from amorphous silicon thin films by high temperature annealing and solid phase epitaxy (SPC), by excimer laser annealing (ELA), or by metal induced crystallization (MIC), which is essentially SPC with a catalyst to induce faster crystal growth at lower temperatures.

The main problem of MC material is the presence of grain boundaries which act as charge trapping sites. For a thick layer of MC film, there is always a random arrangement of grains. A current has to pass through the grain boundaries. Hydrogen passivation is conventionally employed to reduce charge trapping by the grain boundaries.

Another issue common to all thin film devices is the problem of surface reflection. Since the thin film is usually not much thicker than the absorption depth of the incoming photons, some or most of the light can penetrate without being absorbed. It is important to trap the light so that all or most photons can be eventually absorbed. In addition, due to the large refractive index mismatch between silicon and air, large surface reflection occurs, reducing the amount of light going into the silicon film. Texturing of the surface is usually needed to reduce surface reflection and to trap the light.

SUMMARY OF THE INVENTION

According to one embodiment, an ultrathin film of the MC material is used in a solar cell such that there is no grain boundary for the generated current to travel through. If the thickness of the MC film is smaller than the grain size, then the three dimensional (3D) percolation pathway for current transport will become two dimensional (2D). Therefore, the generated charges will not have to cross any grain boundary in reaching the electrodes.

According to another embodiment, a specially structured surface is described that can effectively trap all of the light entering the thin film solar cell. Accordingly, the efficiency of the ultrathin film device is substantially increased compared with existing devices.

FIG. 1 shows a typical photovoltaic device, consisting of a p-doped layer (P layer), an intrinsic layer (I layer), and an n-doped layer (N layer), forming a P-I-N structure. Ohmic contacts are then added to complete the solar cell. Due to the semiconductor junctions, a built-in electric field exists within the intrinsic layer to prevent electrons from diffusing to the P-side and vice versa. Light with photon energy larger than the bandgap of silicon will be absorbed to generate electron-hole pairs, which diffuse to the P- or N-side under the influence of the built-in electric field. Thus a photocurrent is generated.

In a multi-crystalline thin film solar cell, the thickness of the light collection layer is over 1 micron thick in order to absorb most of the light. During construction of the typical MC solar cell, a seed layer of MC silicon is first formed, followed by an epitaxial growth of a thick MC layer with a thickness over 2 microns. This thickness is needed in order to absorb more light to generate the photocurrent. With a thick MC silicon layer, current has to flow across grain boundaries, as shown schematically in FIG. 2. The device presents an effectively 3D grain structure.

According to one embodiment described herein, the thickness of the MC layer is made thinner than the typical grain size. Consequently, as shown in FIG. 3, the grain structure will essentially be 2D. It can be seen that current will now flow from P to N without passing through any grain boundary. Thus the solar cell efficiency per photon absorbed will be significantly increased. In addition, the built-in electric field across the intrinsic layer will be much stronger. This is also conducive to high current generation.

According to one embodiment, multiple layers of P-I-N units are formed in order to increase the light absorption in the ultrathin film device. Specifically, a P-I-N-P-I-N-P-I-N-P-I-N . . . P-I-N solar cell is formed as shown in FIG. 5 by cascading multiple P-I-N units. If the P and N layers are sufficiently doped and thin enough, tunneling will occur so that a reverse N-P junction will not be formed. The N-P layer sandwiched between the I layers will just be an electrode that can supply both electrons and holes simultaneously. If many such PIN layers are formed, the total thickness of the solar cell can be of any thickness.

According to another embodiment, a structured surface is utilized in order to increase the light absorption. Instead of the flat or nearly flat solar cell, the surface of the solar cell has an uneven structure as shown in FIG. 6. It should be noticed that this structured surface is different from the structured surface used in reducing light reflection in conventional solar cells. The roughened surface used in the latter typically has depths of less than 1 micron. In the present invention, the structure is used for light trapping since the thin film is much less than an absorption depth in thickness. This is different from conventional thin film solar cells that are thicker than the absorption depth of several microns.

According to a further embodiment, for particular values of the depth and width and density of such pits, the light can be effectively trapped and eventually absorbed by the ultrathin film. The depth of the surface structure is more than 10 microns deep. In fact the thickness of the thin film should not even affect the overall transmittance and hence the absorbance of the light.

According to one embodiment, a new kind of high-efficiency solar cell making use of high quality ultrathin MC silicon films is fabricated, utilizing ultrathin polycrystalline silicon films. Unlike conventional silicon solar cells, the solar cell described herein is partially transparent.

According to another embodiment, a deeply pitted or columnar structure is used to trap light in the solar cells. In conventional surface structures, the depth is less than 1 micron. The structure described herein is more than 10 microns in height or depth. It is very important that the thin film solar cell is conformal to the pitted or columnar structure of the substrate surface.

DETAILED DESCRIPTION OF THE EMBODIMENTS

Figure 9:
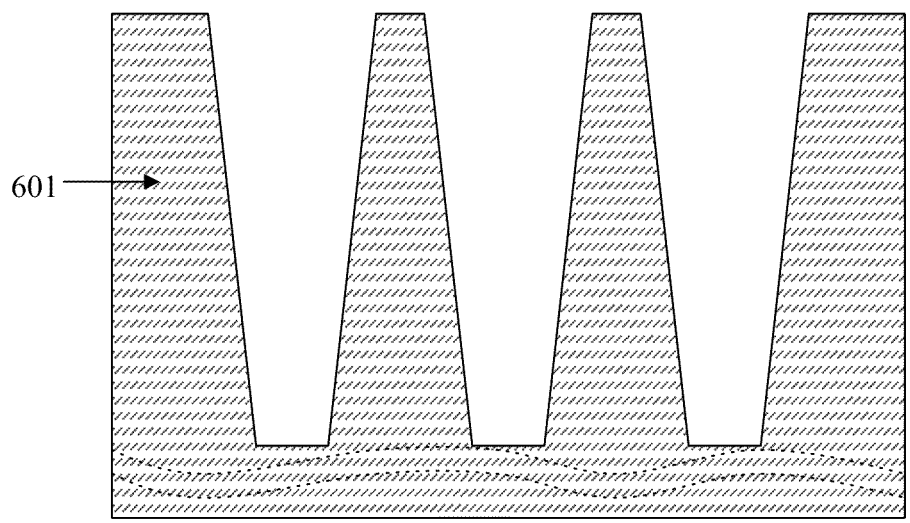
FIG. 9 shows a first step of fabricating a solar cell according to one embodiment.
Figure 10:
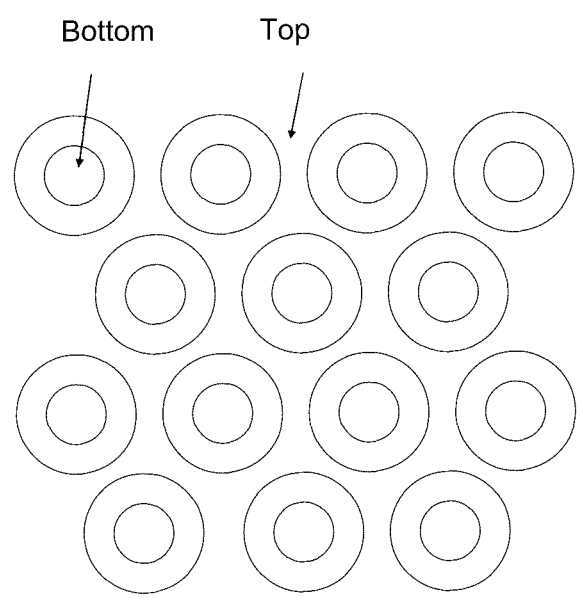
FIG. 10 shows a top view of the structured surface according to one embodiment.

The process of making the solar cell is approximately divided into 5 processing steps. In the first step, one or more uneven structures are formed on a surface of the solar cell as depicted in FIG. 9. According to one embodiment, the uneven structures include one or more pits made into the surface of the substrate 601 of the solar cell as depicted in FIG. 10. The substrate 601 is preferably made of glass. This pitted structures are placed on substrate 601 in a close pack manner as in a honeycomb as shown in FIG. 10. The specific shape of the pits be a hexagonal shape, or circular shape, or square shape, or triangular shape or rectangular shape. According to a further embodiment, the depth of the pits (i.e., the vertical size) is at least 10 microns. The width of the pits (i.e., the lateral size) is 1 to 10 microns.

Figure 11:
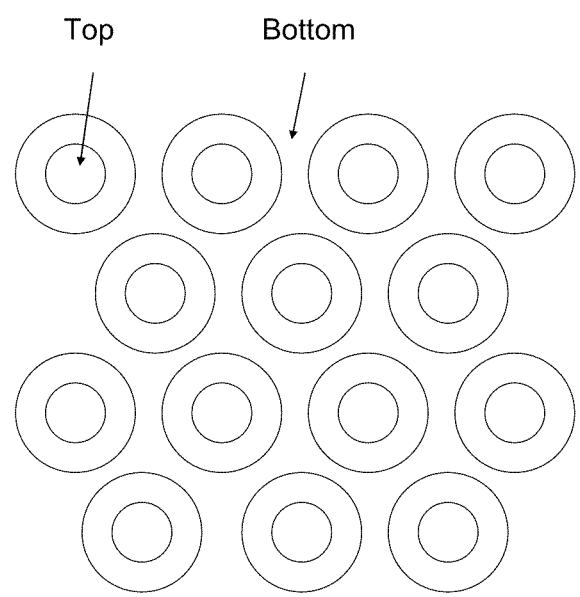
FIG. 11 shows a top view of the structured surface according to another embodiment.

Alternatively, the uneven structures include a plurality of cones or columns as depicted in FIG. 11. The cones or columns can be of hexagonal, square, circular, rectangular or triangular shapes, or of any irregular shapes. In FIG. 11, the top view of the structure is shown for the case of cones. According to a further embodiment, the height of the cones or columns (i.e., the vertical size) is at least 10 microns. The width of the cones or columns (i.e., the lateral size) is 1 to 10 microns.

In the case of pits, the topmost surface of the solar cell is continuous. And in the case of columns or cones, the top surface of the solar cell includes separated areas (the top of the cones).

Figure 1:
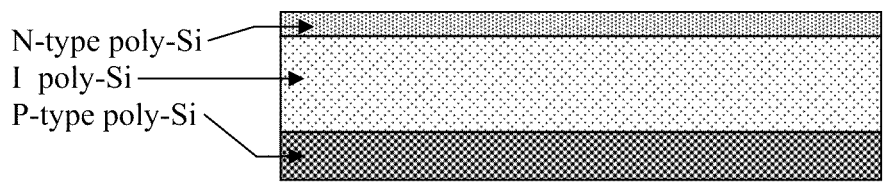
FIG. 1 depicts a typical structure of a photovoltaic device.
Figure 2:
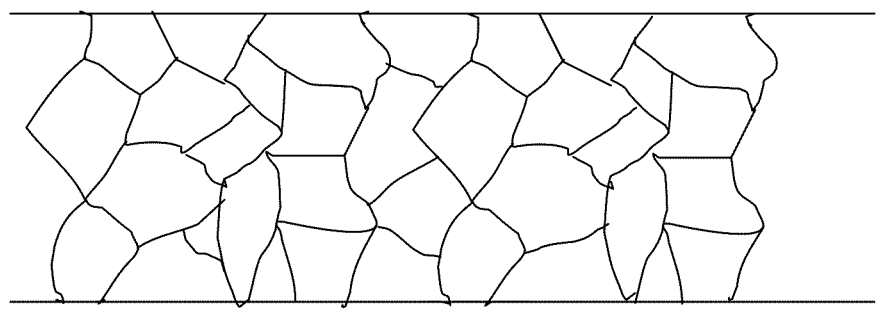
FIG. 2 depicts a schematic diagram of the grain structure of a regular MC film.
Figure 3:
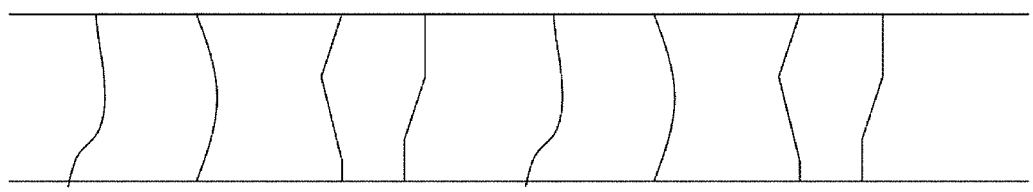
FIG. 3 depicts a schematic diagram of the grain structure of an ultrathin MC film.
Figure 4:
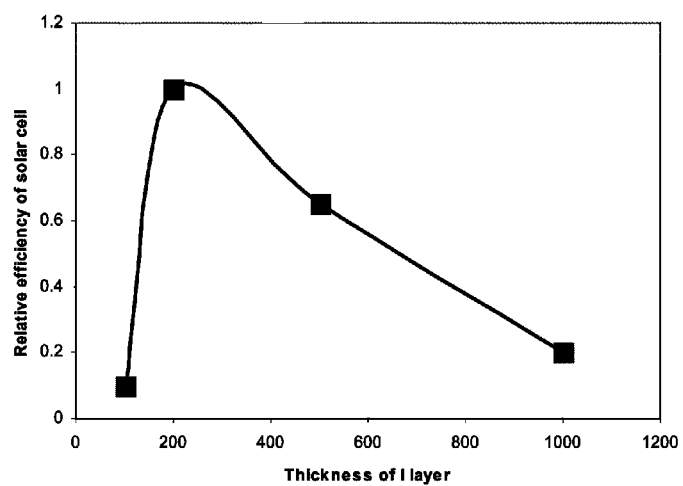
FIG. 4 depicts the normalized energy conversion efficiency of a MC solar cell as a function of film thickness.
Figure 5:
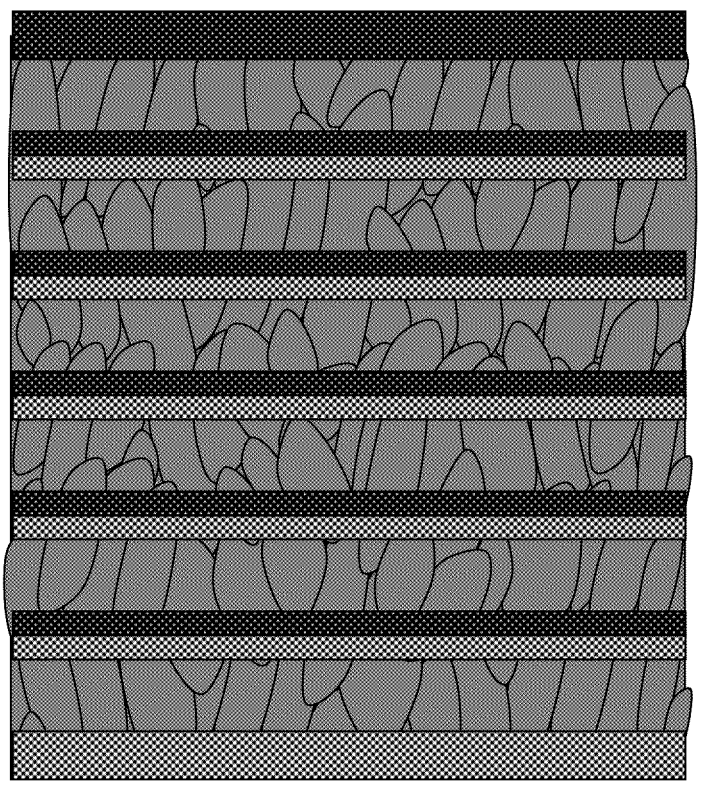
FIG. 5 depicts a multi-cell photovoltaic device making use of ultrathin MC films according to one embodiment.
Figure 6:
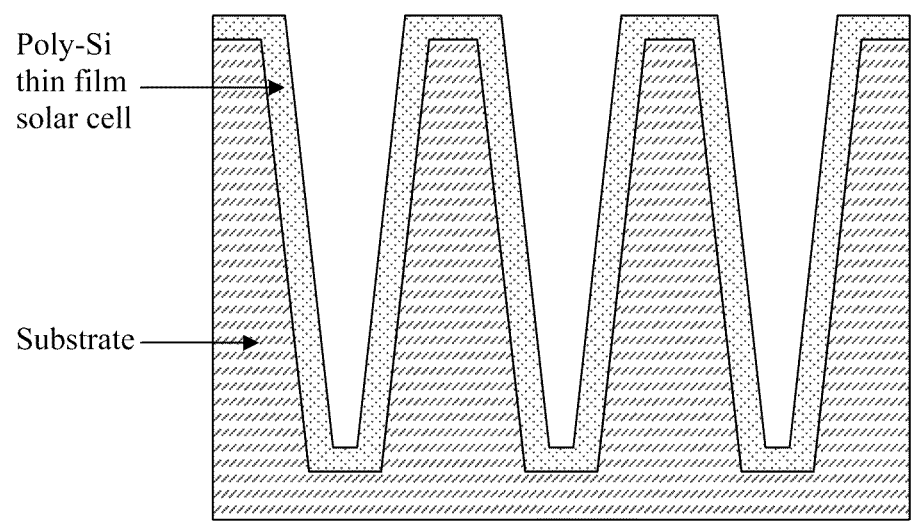
FIG. 6 depicts a proposed photovoltaic device making use of single cell ultrathin MC films on a structured surface according to one embodiment.
Figure 7:
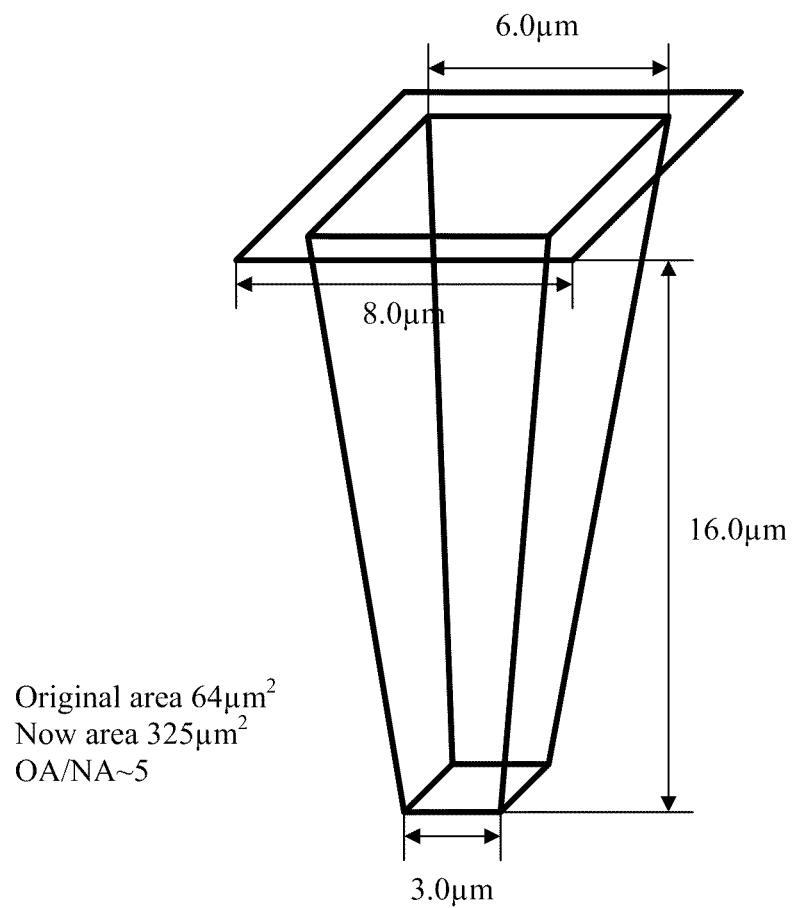
FIG. 7 shows an example of a pit in the structured surface.
Figure 8:
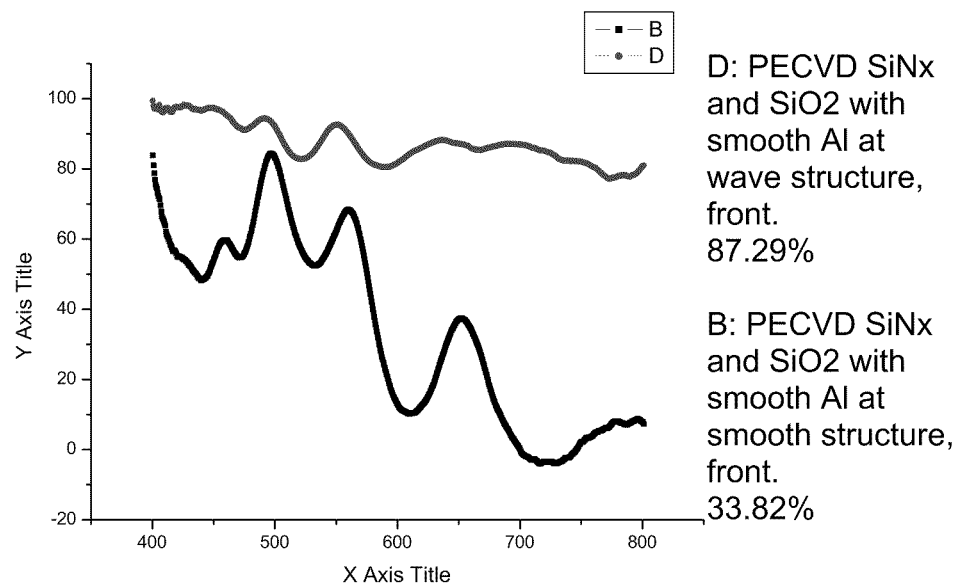
FIG. 8 shows the measured transmittance of the structured surface versus an unstructured surface.

According to one embodiment, the slanted surface has a certain angle so that light is effectively trapped by the solar cell. FIG. 7 shows an example of a rectangular pit. The dimensions are 6×8 microns on top and 3×4 microns at the bottom. The height of the pit is 16 microns. Thus the angle of the slanted surface is 7.1 and 5.4 degrees on the two sides respectively.

Figure 12:
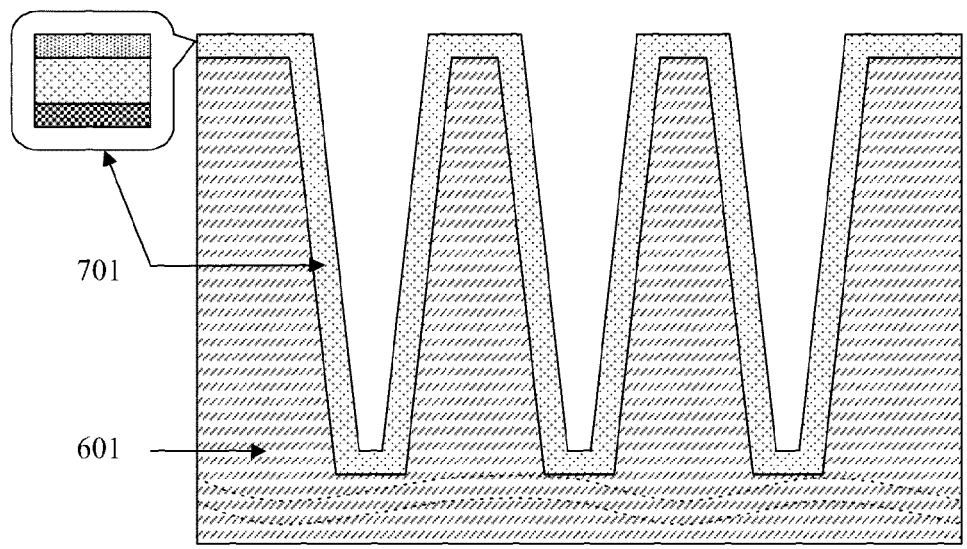
FIG. 12 shows a second step of fabricating a solar cell according to the embodiment.

Once a structured surface is formed, the second step includes depositing multiple layers 701 on the surface. This is shown in FIG. 12. The layers 701 includes one or more thin layers (i.e., thin films) of polycrystalline silicon. Specifically, the multiple layers 701 consist of N-doped layer, intrinsic layer and P-doped layer which form a basic unit of photovoltaic cell. The order can be P-I-N or N-I-P. The layers should be deposited on the structured surface in a conformal manner, namely all surfaces, slanted or curved, should be covered. This can be accomplished with a number of thin film growing techniques, such as chemical vapor deposition (CVD). Physical vapor deposition is not appropriate as there will be shadowing effect making the thin film not uniform in thickness or discontinuous. Typically the P layer is 50-100 nm, the I layer is 200-300 nm and the N layer is 30-50 nm. The P-I-N or N-I-P solar cell will have to be crystallized into polycrystalline thin films. This can be accomplished simply by thermal annealing for the case of solid phase epitaxial (SPC) films. Metal induced crystallization (MIC) can also be used as well. In fact a number of techniques of converting amorphous films to polycrystalline thin films can be employed. Multiple layer 701 should also include an antireflection layer on top to reduce light reflection loss. Such an antireflection layer also acts as an insulator for later patterning of the solar cell.

Figure 13:
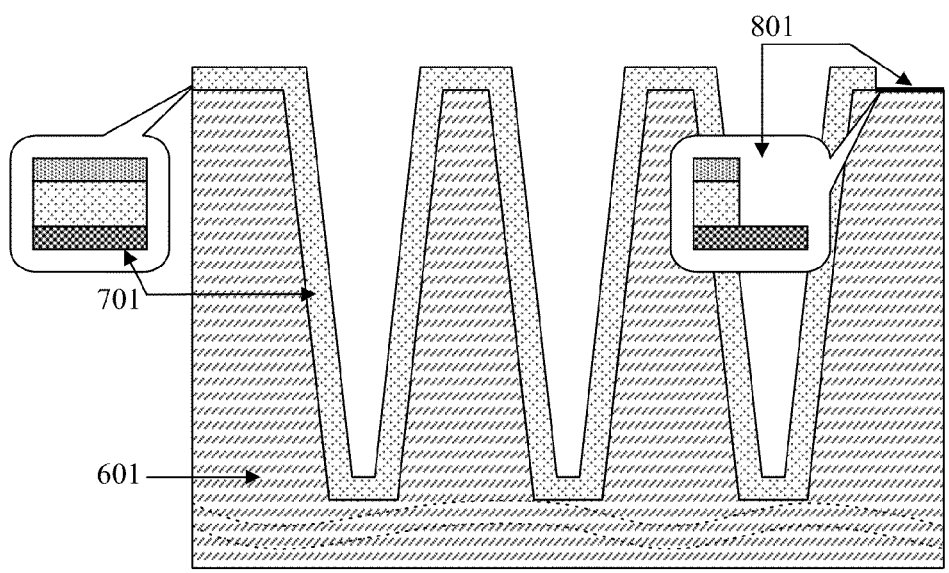
FIG. 13 shows a third step of fabricating a solar cell according to the embodiment.

In the third step, contact holes 801 are formed on the layer 701. This step is shown in FIG. 13. This can be done by photolithographic etching of the top layers. If the photovoltaic structure is N-I-P, then the top N and I layers are removed exposing the P layer. If the photovoltaic structure is a P-I-N, then the top P and I layers are removed exposing the n layer.

Figure 14:
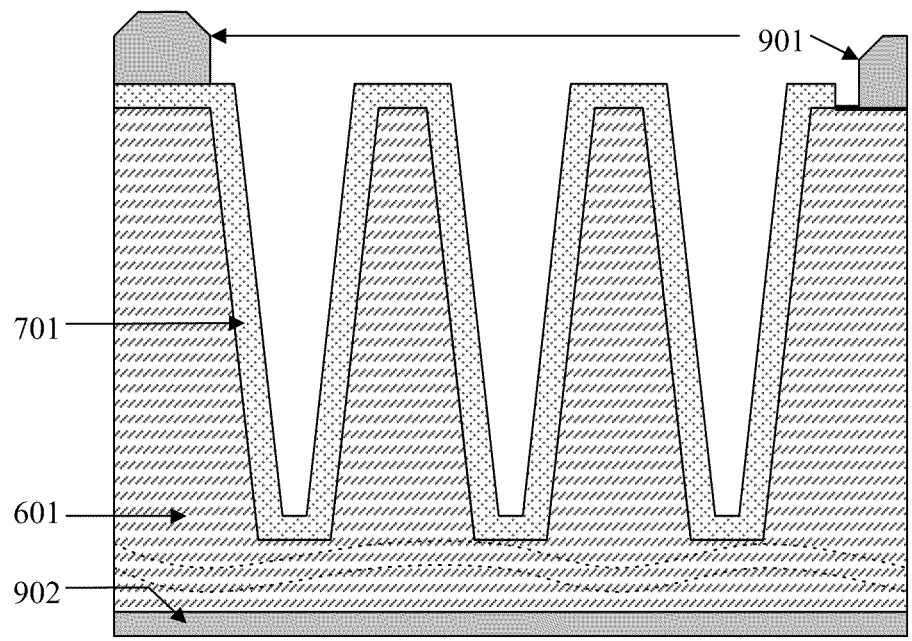
FIG. 14 shows a fourth step of fabricating a solar cell according to the embodiment.

In the fourth step, metal contacts 901 are made on the P and N layers as shown in FIG. 14.

In the fifth step, the same metallic layer 901 (i.e., a metal mirror) is then applied to the backside of the substrate to reflect light. This is shown in FIG. 14. This backside reflector is necessary so that light escaping the first structured surface layer will be reused again. The metal layer is of the order of 1 micron thick.

Figure 15:
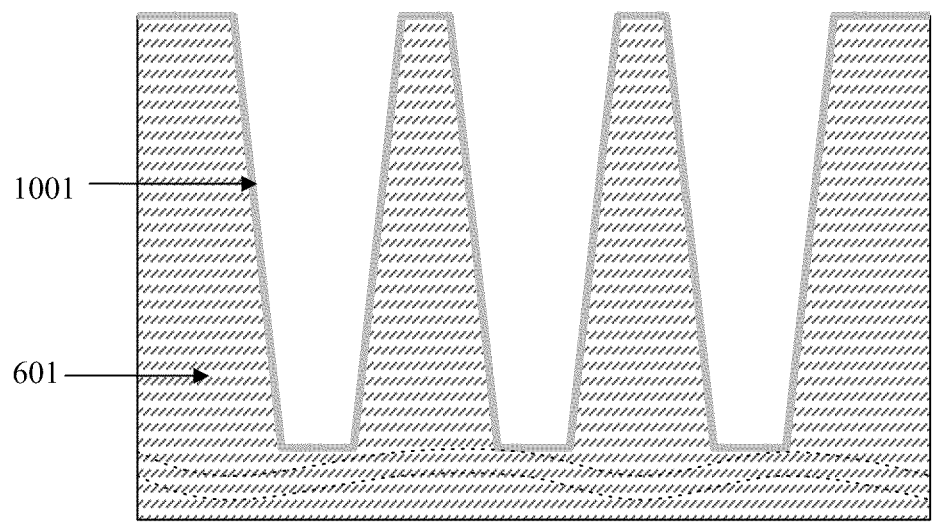
FIG. 15 shows a fifth step of fabricating a solar cell according to the embodiment.

In another embodiment, a transparent substrate is used. The first step of preparing the structured surface is the same manner as in the above-discussed embodiment. Specifically, in the second step, a layer of transparent conductive oxide material 1001 is coated on the substrate as shown in FIG. 15. This transparent conductive material can be indium oxide, tin oxide or indium tin oxide or zinc oxide. There are many such transparent conductive materials available that can be used in this invention.

Figure 16:
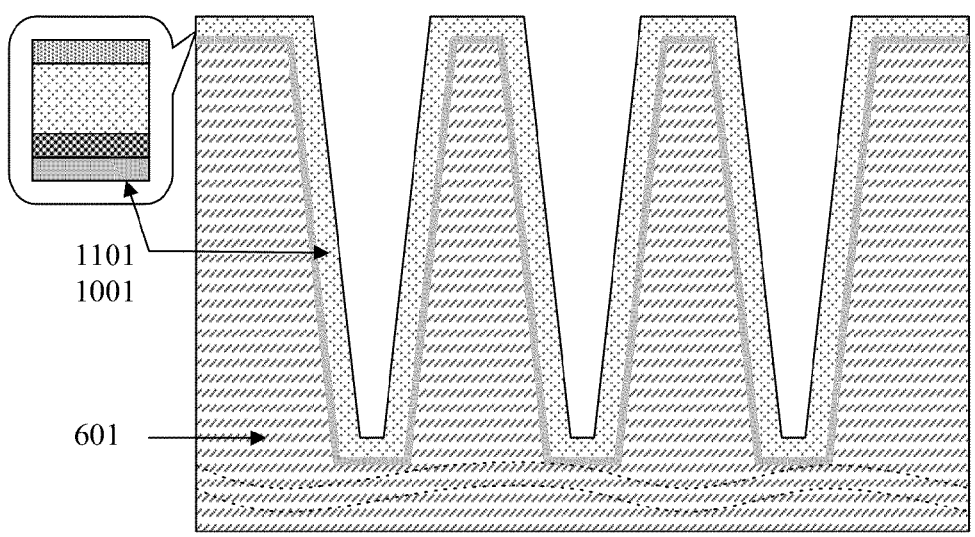
FIG. 16 shows a second step of fabricating a solar cell according to an alternative embodiment.

In the third step, multiple layers 1101 are deposited on the said surface as shown in FIG. 16. The multiple layers 1101 consist of N-doped layer, intrinsic layer and P-doped layer which form a basic unit of photovoltaic cell. The order can be P-I-N or N-I-P. The layers should be deposited on the structured surface in a conformal manner, namely all surfaces, slanted or curved, should be covered. This can be accomplished with a number of thin film growing techniques, such as chemical vapor deposition (CVD). Physical vapor deposition is not appropriate as there will be shadowing effect making the thin film not uniform in thickness or discontinuous. Typically the P layer is 10-30 nm, the I layer is 200-300 nm and the N layer is 10-30 nm. The P-I-N or N-I-P solar cell will have to be crystallized into polycrystalline thin films. This can be accomplished simply by thermal annealing for the case of solid phase epitaxial (SPC) films. Metal induced crystallization (MIC) can also be used as well. In fact a number of techniques of converting amorphous films to polycrystalline thin films can be employed. Multiple layer 1101 should also include an antireflection layer on top to reduce light reflection loss. Such an antireflection layer also acts as an insulator for later patterning of the solar cell.

Figure 17:
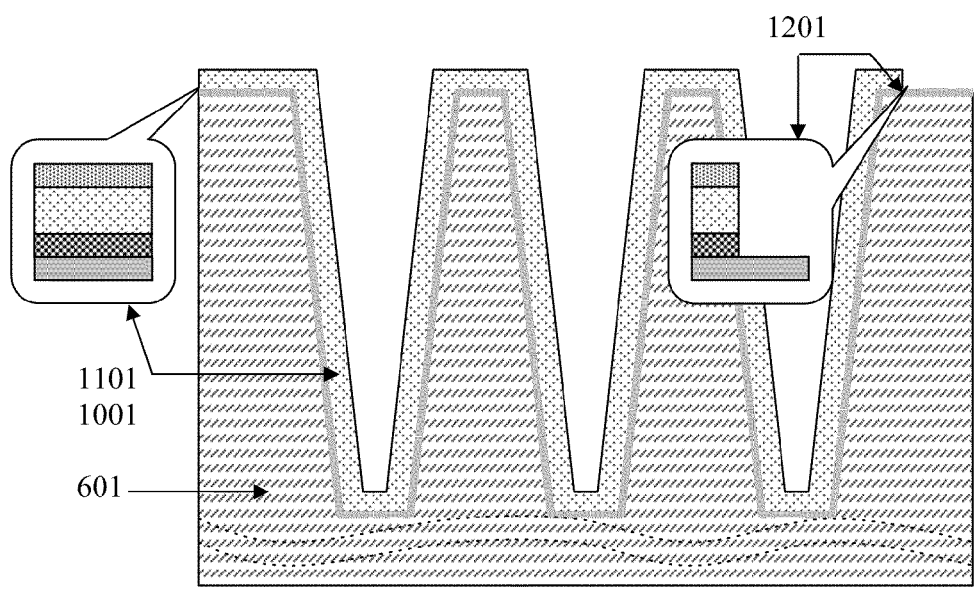
FIG. 17 shows the third step of the second preferred embodiment.

In the fourth step, contact holes 1201 are formed on the layer 1201 as shown in FIG. 17. This can be done by photolithographic etching of the top layers. If the photovoltaic structure is N-I-P, then the top N and I layers are removed exposing the P layer. If the photovoltaic structure is a P-I-N, then the top P and I layers are removed exposing the n layer.

Figure 18:
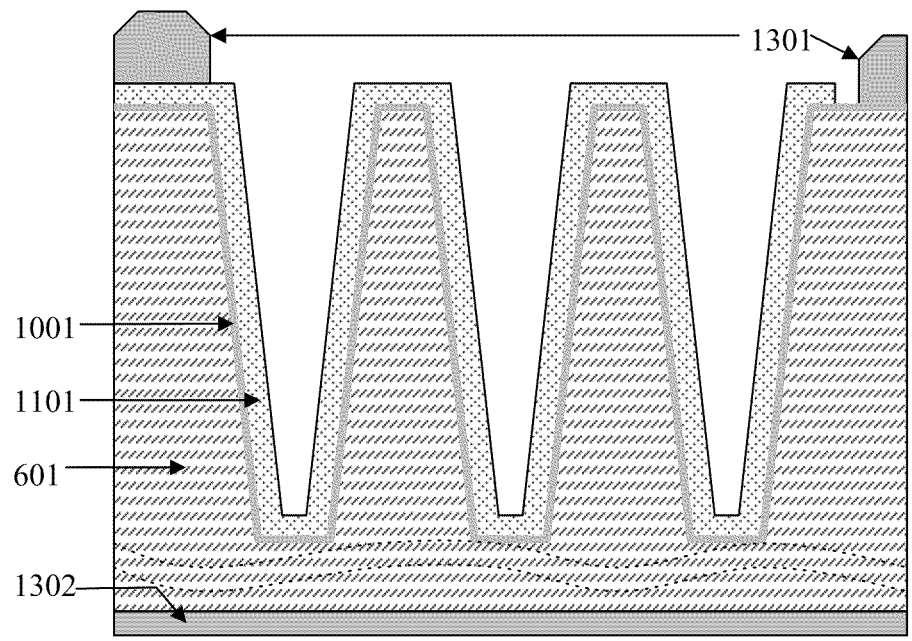
FIG. 18 shows the fourth step of the second preferred embodiment.

In the fifth step, metal contacts 1301 are made to the P and N layers. These metal contacts complete the solar cell. A metallic layer is then applied to the backside of the substrate to reflect light as shown in FIG. 18. This backside reflector is necessary so that light escaping the first structured surface layer will be reused again. The metal layer is of the order of 1 micron thick.

According to some embodiments, such as those described above, the solar cell is able to absorb incident light on the thin film solar cell side of the substrate.

According to some other embodiments, the solar cell is made to absorb incident light entering the solar cell from the substrate side of the thin film solar cell.

Figure 19:
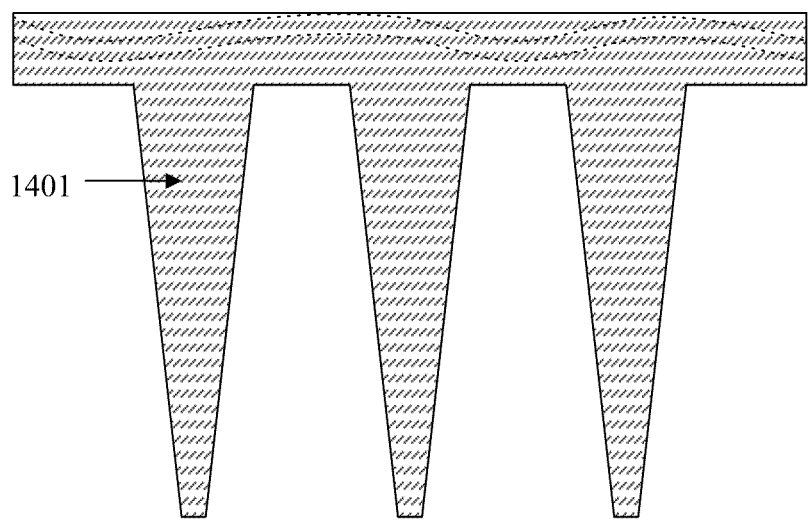
FIG. 19 shows the first step of the third and fourth preferred embodiments.
Figure 20:
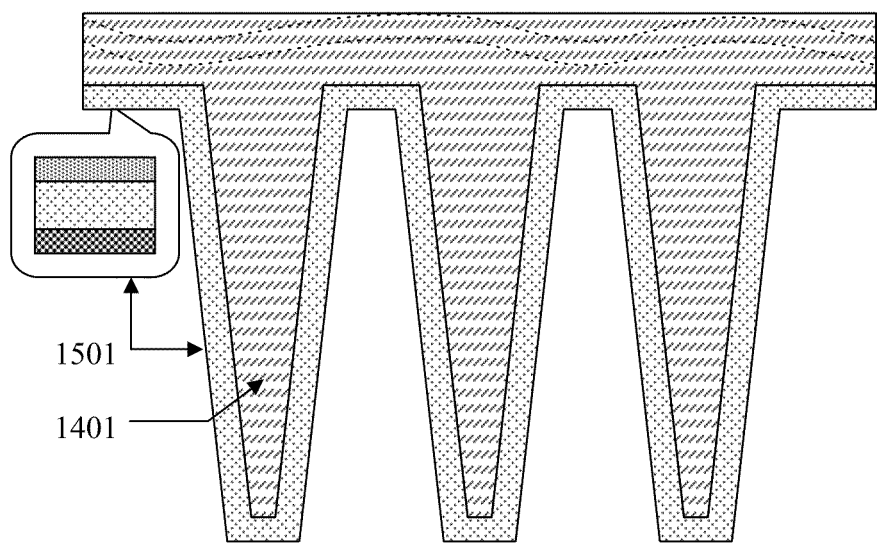
FIG. 20 shows the second step of the third preferred embodiment.

According to one of these embodiments as depicted in FIG. 19, in the first step, a structured surface 1401 is fabricated, including one or more pits (or columns). In the second step, a multiple-layer solar cell unit 1501 including polycrystalline silicon is deposited on the surface as shown in FIG. 20. The multiple layers 1501 consist of an N-doped layer, an intrinsic layer (I layer), and a P-doped layer which form a basic unit of photovoltaic cell. Alternatively, the order can be P-I-N or N-I-P. The layers are deposited on the structured surface in a conformal manner, namely all surfaces, slanted or curved, should be covered. This can be accomplished with a number of thin film growing techniques, such as chemical vapor deposition (CVD). Physical vapor deposition is not appropriate as there will be shadowing effect making the thin film not uniform in thickness or discontinuous. Typically the P layer is 10-30 nm, the I layer is 200-300 nm and the N layer is 10-30 nm. The P-I-N or N-I-P solar cell will have to be crystallized into polycrystalline thin films. This can be accomplished simply by thermal annealing for the case of solid phase epitaxial (SPC) films. Metal induced crystallization (MIC) can also be used as well. In fact a number of techniques of converting amorphous films to polycrystalline thin films can be employed. The multiple-layer solar cell unit 1501 should also include an antireflection layer on top to reduce light reflection loss. Such an antireflection layer also acts as an insulator for later patterning of the solar cell.

Figure 21:
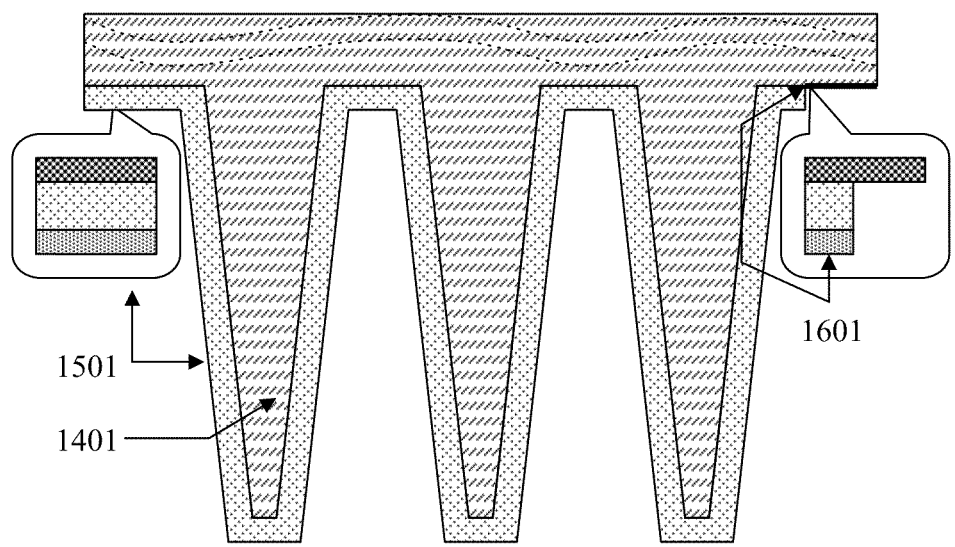
FIG. 21 shows the third step of the third preferred embodiment.

In the third step, contact holes 1601 are formed on the layer 1501 as shown in FIG. 21. This can be done by photolithographic etching of the top layers. If the photovoltaic structure is N-I-P, then the top N and I layers are removed exposing the P layer. If the photovoltaic structure is a P-I-N, then the top P and I layers are removed exposing the n layer.

Figure 22:
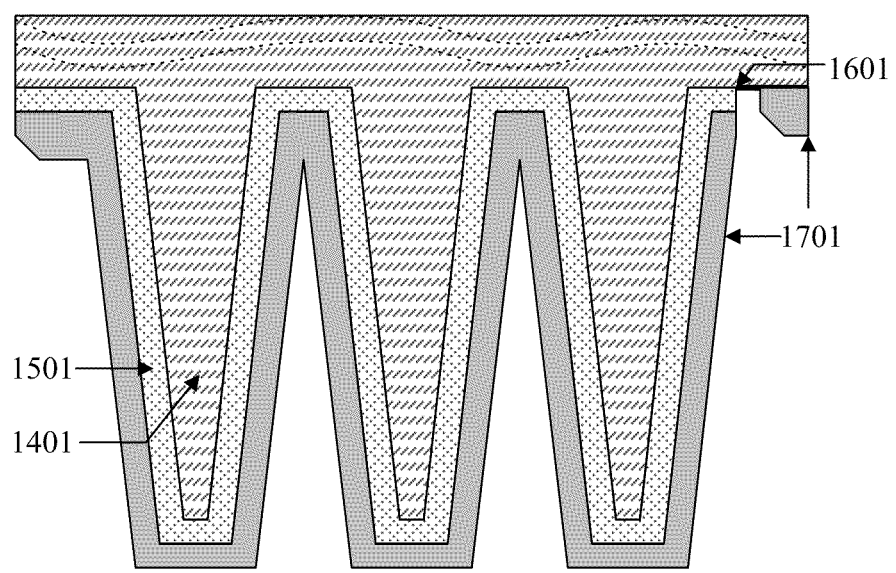
FIG. 22 shows the fourth step of the third preferred embodiment.

In the fourth step, a combination of a dielectric and a metal reflector and metal contacts 1701 are made to the entire structure as shown in FIG. 22. The metal reflector is not connected to the N layer while the metal contact is connected to the N and P-layers through contact holes. These layers complete the solar cell. The metal layer is of the order of 1 micron thick while the dielectric layer can be very thin. The purpose of the dielectric layer is to avoid contamination by the metal to the P-I-N solar cell.

Figure 23:
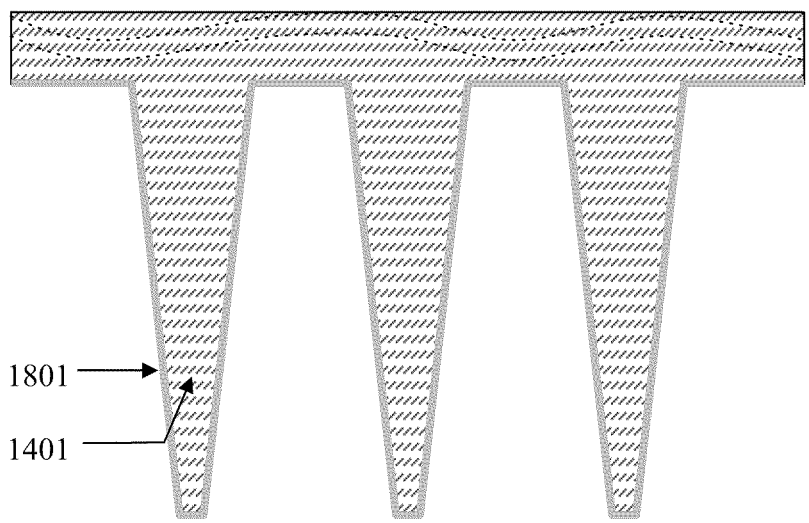
FIG. 23 shows the second step of the fourth preferred embodiment.

According to another embodiment, in the first step, a structured surface 1401 is fabricated in the same manner as that shown in FIG. 19. In the second step, a layer of transparent conductive oxide material 1801 is coated on the said structured surface 1401. It is shown in FIG. 23. This transparent conductive material can be indium oxide, tin oxide or indium tin oxide or zinc oxide. There are many such transparent conductive materials available that can be used in this invention.

Figure 24:
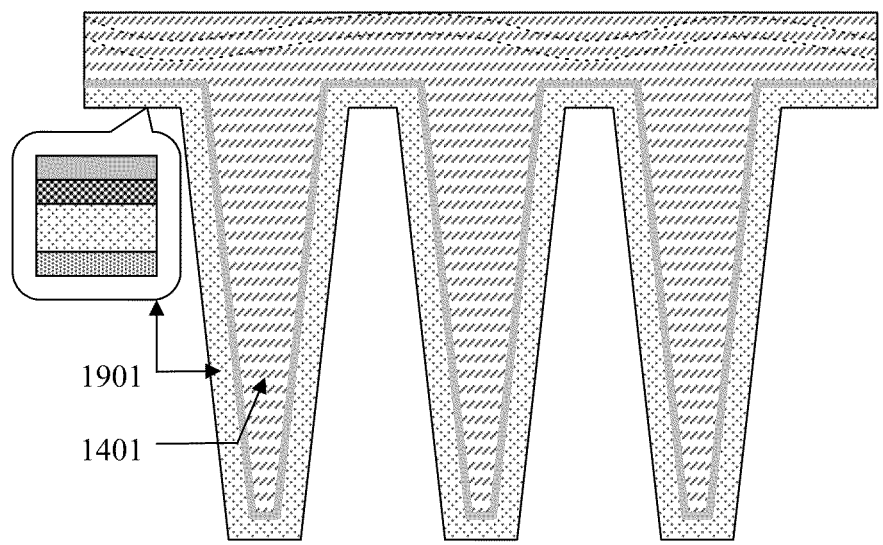
FIG. 24 shows the third step of the fourth preferred embodiment.

In the third step, a multiple-layer solar cell unit 1901 is deposited on the said surface as shown in FIG. 24. The multiple layers 1901 consist of N-doped layer, intrinsic layer and P-doped layer which form a basic unit of photovoltaic cell. The order can be P-I-N or N-I-P. The layers should be deposited on the structured surface in a conformal manner, namely all surfaces, slanted or curved, should be covered. This can be accomplished with a number of thin film growing techniques, such as chemical vapor deposition (CVD). Physical vapor deposition is not appropriate as there will be shadowing effect making the thin film not uniform in thickness or discontinuous. Typically the P layer is 10-30 nm, the I layer is 200-300 nm and the N layer is 10-30 nm. The P-I-N or N-I-P solar cell will have to be crystallized into polycrystalline thin films. This can be accomplished simply by thermal annealing for the case of solid phase epitaxial (SPC) films. Metal induced crystallization (MIC) can also be used as well. In fact a number of techniques of converting amorphous films to polycrystalline thin films can be employed. The multiple-layer solar cell unit 1901 should also include an antireflection layer on top to reduce light reflection loss. Such an antireflection layer also acts as an insulator for later patterning of the solar cell.

Figure 25:
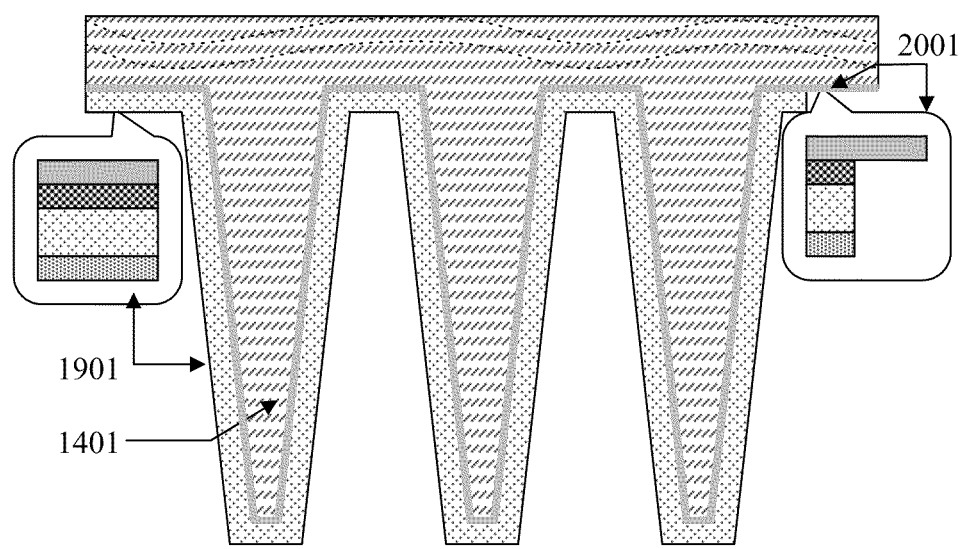
FIG. 25 shows the fourth step of the fourth preferred embodiment.

In the fourth step, contact holes 2001 are formed on the layer 1901. This step is shown in FIG. 25. This can be done by photolithographic etching of the top layers. If the photovoltaic structure is N-I-P, then the top n and i layers are removed exposing the p layer. If the photovoltaic structure is a P-I-N, then the top P and I layers are removed exposing the N layer.

Figure 26:
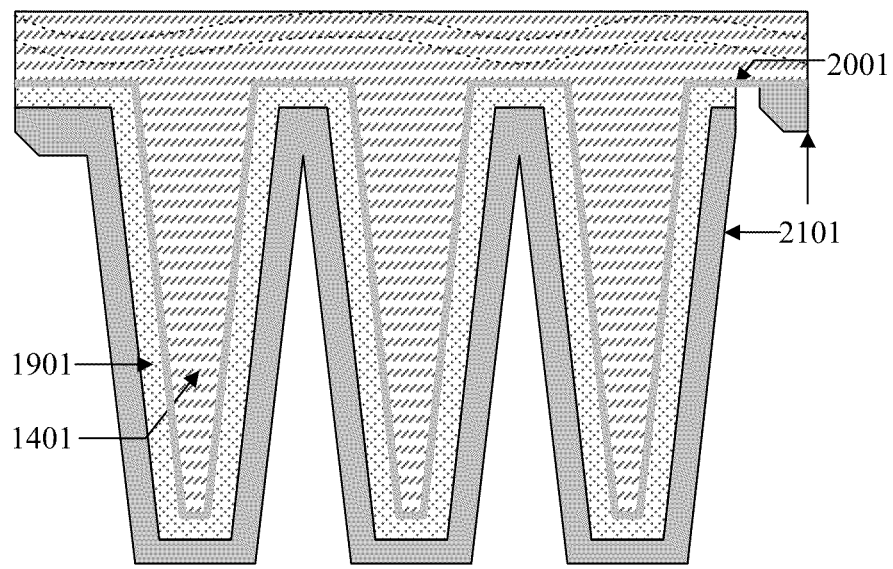
FIG. 26 shows the fifth step of the fourth preferred embodiment.

In the fifth step, a dielectric layer and a metal reflector 2101 are made to the entire structure. It is shown in FIG. 26. Electrical contacts are then connected to the N and P layers to complete the solar cell. The metal layer is of the order of 1 micron thick while the dielectric layer can be very thin.

Various operations including deposition and etching described above are performed on standard equipments for processing semiconductor devices and are well known to one skilled in the art.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. An ultrathin film solar cell comprising:
a transparent substrate having a first surface, the first surface having one or more uneven structures, wherein concave or convex regions corresponding to the one or more uneven structures have a vertical size of at least 10 microns;
an ultrathin film P-I-N solar cell unit deposited on the first surface, the ultrathin film P-I-N solar cell unit comprising a polycrystalline silicon P-type layer, a polycrystalline silicon N-type layer, and a polycrystalline silicon intrinsic layer between the polycrystalline silicon P-type layer and the polycrystalline silicon N-type layer, wherein thickness of the polycrystalline silicon intrinsic layer is vertically co-extensive with grains of the polycrystalline silicon intrinsic layer so as to provide a two-dimensional grain structure in the polycrystalline silicon intrinsic layer, configured to allow current flow through the polycrystalline silicon intrinsic layer that does not cross any grain boundary of the polycrystalline silicon intrinsic layer, and wherein the polycrystalline silicon P-type layer, the polycrystalline silicon N-type layer, and the polycrystalline silicon intrinsic layer are separate layers having distinct boundaries; and
one or more electrical contacts connected to the polycrystalline silicon P-type layer and the polycrystalline silicon N-type layer of the ultrathin film P-I-N solar cell;
wherein the polycrystalline silicon P-type layer of the ultrathin film P-I-N solar cell unit is 10 to 200 nm thick, the polycrystalline silicon intrinsic layer of the ultrathin film P-I-N solar cell unit is 200 to 300 nm thick, and the polycrystalline silicon N-type layer of the ultrathin film P-I-N solar cell unit is 10 to 200 nm thick.

2. The ultrathin film solar cell of claim 1, wherein the one or more uneven structures include one or more pits.

3. The ultrathin film solar cell of claim 1, wherein the one or more uneven structures include one or more columns.

4. The ultrathin film solar cell of claim 1, further comprising a metal mirror disposed on a second surface of the substrate.

5. The ultrathin film solar cell of claim 1, further comprising:
an insulating layer disposed on the ultrathin film P-I-N solar cell unit; and
a metal mirror disposed on the insulating layer.

6. The ultrathin film solar cell of claim 1, further comprising one or more additional P-I-N solar cell units, wherein the ultrathin film P-I-N solar cell unit and the one or more additional P-I-N solar cell units are organized in a cascaded structure.

7. The ultrathin film solar cell of claim 1, wherein the transparent substrate is glass or quartz.

8. The ultrathin film solar cell of claim 1, wherein a lateral size of each of the one or more uneven structures is 1 to 10 microns.

9. The ultrathin film solar cell of claim 4, wherein the metal mirror is made of aluminum, gold or chromium.

10. A method for making an ultrathin film solar cell, comprising:
- providing a transparent substrate having a first surface, the first surface having one or more uneven structures, wherein concave or convex regions corresponding to the one or more uneven structures have a vertical size of at least 10 microns;
- forming an ultrathin film P-I-N solar cell unit deposited on the first surface, the ultrathin film P-I-N solar cell unit comprising a polycrystalline silicon P-type layer, a polycrystalline silicon N-type layer, and a polycrystalline silicon intrinsic layer between the polycrystalline silicon P-type layer and the polycrystalline silicon N-type layer, wherein thickness of the polycrystalline silicon intrinsic layer is vertically co-extensive with grains of the polycrystalline silicon intrinsic layer so as to provide a two-dimensional grain structure in the polycrystalline silicon intrinsic layer, configured to allow current flow through the polycrystalline silicon intrinsic layer that does not cross any grain boundary of the polycrystalline silicon intrinsic layer, and wherein the polycrystalline silicon P-type layer, the polycrystalline silicon N-type layer, and the polycrystalline silicon intrinsic layer are separate layers having distinct boundaries; and
- forming one or more electrical contacts connected to the polycrystalline silicon P-type layer and the polycrystalline silicon N-type layer of the ultrathin film P-I-N solar cell;
- wherein the polycrystalline silicon P-type layer of the ultrathin film P-I-N solar cell unit is 10 to 200 nm thick, the polycrystalline silicon intrinsic layer of the ultrathin film P-I-N solar cell unit is 200 to 300 nm thick, and the polycrystalline silicon N-type layer of the ultrathin film P-I-N solar cell unit is 10 to 200 nm thick.

11. The method of claim 10, further comprising:
forming a metal mirror disposed on a second surface of the substrate.

12. The method of claim 10, further comprising:
forming an insulating layer disposed on the thin film P-I-N solar cell unit; and
forming a metal mirror disposed on the insulating layer.

* * * * *